Sept. 27, 1966 R. L. BAKER 3,275,947
FREQUENCY CONTROLLED TUNING FORK OSCILLATOR
Filed Dec. 9, 1963
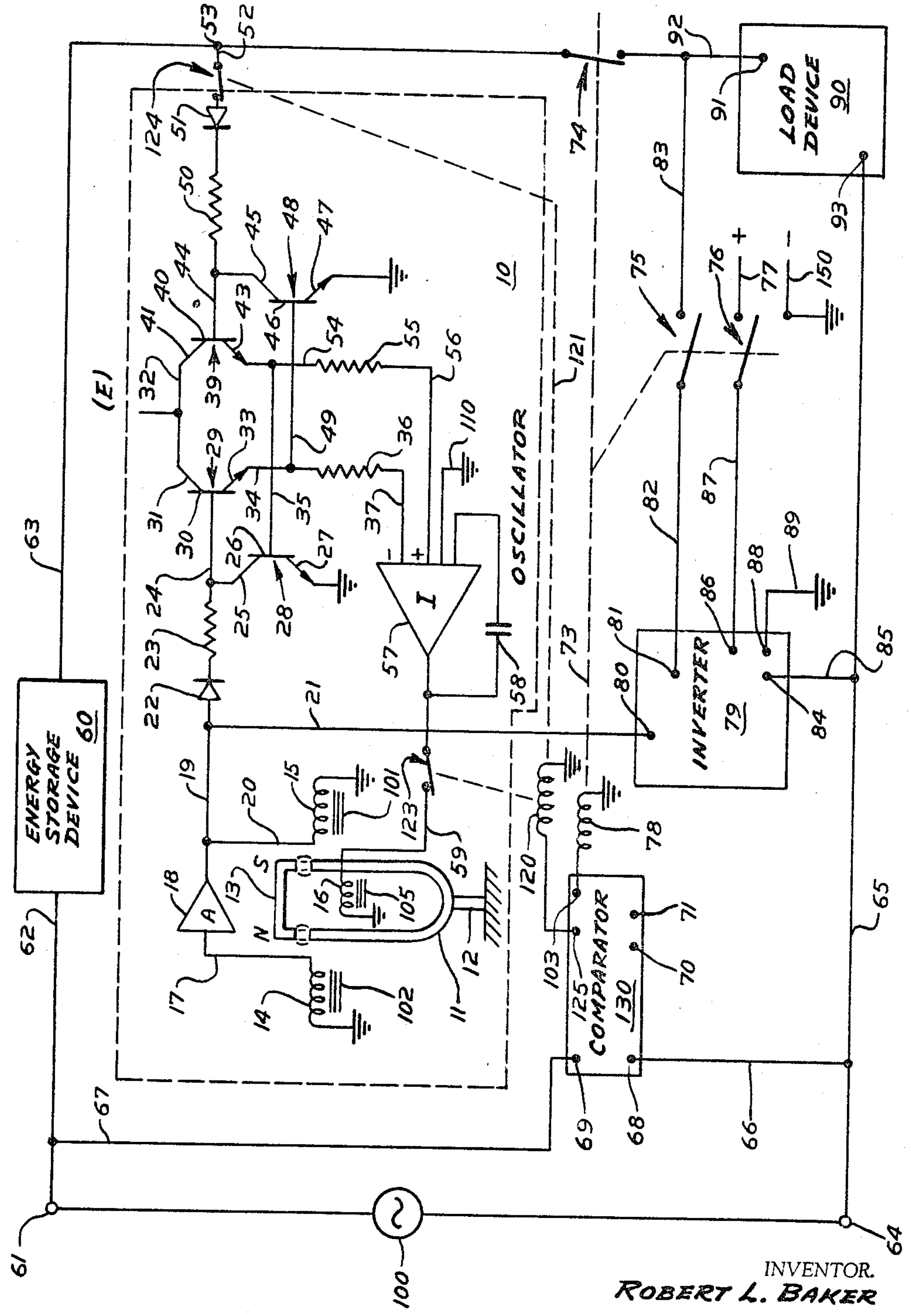
INVENTOR.
ROBERT L. BAKER
BY
Carlson, Carlson & Sturm
ATTORNEYS United States Patent Office 3,275,947
Patented Sept. 27, 1966

3,275,947
FREQUENCY CONTROLLED TUNING FORK OSCILLATOR
Robert L. Baker, Spring Lake Park, Minn. (8191 Spring Lake Park Road, Minneapolis, Minn. 55432)
Filed Dec. 9, 1963, Ser. No. 329,091
6 Claims. (Cl. 331—27)

This invention relates generally to oscillators and is more particularly directed to tuning fork type oscillators which may be controlled to provide a predetermined frequency of oscillation.

The present state of the art in many areas of electronics has required the development of stable and accurate sources of alternating potential. One such source which has proven to be particularly useful is a tuning fork oscillator in which the mechanical vibration of a tuning fork at its natural frequency is utilized to provide a fairly accurate and stable frequency determining element in an electronic oscillator. It is noted, however, that the maintenance of synchronism of the frequency and phase of a tuning fork oscillator, a requirement in many applications, is not easily attained nor is a fine adjustment of the frequency of operation of a particular tuning fork element easily obtained without sacrificing one or more of the inherent advantages of a tuning fork element.

Many arrangements have been proposed in the prior art for modifying the frequency of operation of a tuning fork element. For example, the mass of the tines of the fork may be modified by adding or removing material to affect the natural frequency of oscillation, or a brute force technique for forcing the tuning fork to operate at a different frequency other than its natural frequency may be utilized by applying a magnetic driving force of sufficient amplitude and suitable frequency. A further method of providing a fine adjustment for the frequency of a tuning fork may be seen in the Godbey Patent No. 2,928,308 in which the spacial relationship of a physically movable magnet with the tines of a tuning fork is utilized to affect the frequency of operation of the tuning fork through either phenomena of magnetic force of attraction between the magnet and the tines of the fork or through modification of a magnetic flux present in the fork due to a permanent magnet utilized in connection with the driving coil. In either case, the change in frequency which occurs is the result of change in the forces which are magnetically applied to the fork tines.

In applying the principles of my invention, I have discovered that the natural frequency of oscillation of a tuning fork may be modified by the application of a magnetic flux through a magnetic circuit which includes a source of magnetic energy, substantially all of which is transferred to and continues through a magnetic circuit which includes the vibrating portions of a tuning fork. The relative magnitude of the magnetic flux affects a change in the resonant frequency of the tuning fork by affecting the value of Young's modulus and such change may be varied over a substantially larger range than heretofore attained by other methods and apparatus of the prior art. As will be noted below in connection with the detailed description of a preferred embodiment of my invention, a tuning fork oscillator which may be easily controlled over a substantial range of frequencies may easily be constructed by applying the principles of my invention.

It is therefore an object of my invention to provide an improved tuning fork oscillator.

Another object of my invention is to provide a novel method of controlling the natural frequency of oscillation of a tuning fork.

A still further object of my invention is to provide an improved tuning fork oscillator which is easily adjustable in frequency of operation.

Another object of my invention is to provide a tuning fork oscillator which may be easily synchronized with a reference frequency.

These and other objects of my invention will become apparent from a consideration of the appended specification, claims and drawing in which the sole figure illustrates, in schematic and block diagram form, an electrical distribution system which embodies a frequency controllable tuning fork oscillator embodying the principles of my invention.

Referring now to the drawing, I have illustrated a load device 90 which is adapted to be energized from a suitable source of alternating current potential of predetermined frequency and magnitude, 100, or from an inverter 79 which is adapted to supply an alternating current of like potential, frequency and in phase synchronism with the source of alternating current 100 upon failure of said source.

Load device 90 is provided with a pair of input terminals 92 and 93 which are connected to a further pair of terminals 61 and 64 through suitable means to be described below. Terminals 61 and 64 are connected to a suitable source of alternating current potential of predetermined phase and frequency, 100. Terminal 61 is connected to terminal 92 on load device 90 through conductor 62, energy storage device 60, conductor 63, normally closed contact assembly 74 and conductor 92. Terminal 93 on load device 90 is connected to terminal 64 through conductor 65. It may be noted that energy storage device 60 is a device which possesses the characteristics of tending to maintain the flow of current therethrough upon failure of the source of alternating current connected to terminals 61 and 64 and may be comprised of a constant voltage regulator as supplied by the Sola Manufacturing Company. Energy storage device 60 may further be defined as a means for maintaining a constant voltage output for a finite time interval following the removal of the energy normally supplied to the input thereof. An example of such a device and an explanation of the principles of operation, including the components utilized therein, may be seen in Bulletin No. CV–200, published by the Sola Electric Company of Chicago, Illinois.

Inverter 79 has a pair of output terminals 81 and 84, a pair of terminals 86 and 88 adapted for connection to a suitable source of direct current, and an input terminal 80 which is adapted to be connected to a suitable source of reference signal potential for synchronization therewith to provide an output under conditions to be described below. Output terminal 81 is connected to terminal 91 on load device 90 through conductor 82, normally open switch assembly 75, conductor 83 and conductor 92. Output terminal 84 on inverter 79 is connected to terminal 93 on load device 90 through conductor 85 and conductor 65. Terminal 86 is connected to the positive terminal on, for example, a battery, through conductor 87, normally open switch assembly 76 and conductor 77. Terminal 88 is connected to ground through conductor 89 and the negative terminal on the source of electrical energy is also connected to ground through conductor 150. Inverter 79 may be, for example, any one of a number of commercially available solid state inverters which are adapted to provide a substantially sinusoidal output in synchronism with a source of reference signal potential upon energization from a source of direct current energy. Numerous examples of such inverters may easily be obtained from a consideration of the published references available in the prior art relating to this type of apparatus and a suitable design for such apparatus may easily be determined by one skilled in the art with which this invention is concerned.

A comparator 130 having input terminals 68 and 69 is connected across terminals 61 and 64 through conductors 66 and 67, respectively. Comparator 130 is also provided with a pair of terminals 70 and 71 which may be connected to a suitable source of electrical energy therefor and is further provided with a pair of output terminals 103 and 125. A relay winding 78 is connected intermediate output terminal 103 and ground. A driving means 73 is associated with relay winding 78 for actuation of contact assemblies 74, 75 and 76 upon energization of relay winding 78. A further relay winding 120 is connected intermediate output terminal 125 and ground. Driving means 121 connected to relay winding 120 is operatively connected to normally closed contact assemblies 59 and 52 in oscillator 10. Relay winding 120 is adapted to be energized simultaneously with relay winding 78 and to be de-energized (through circuit means not shown) a predetermined time interval before relay winding 78 is de-energized. Comparator 130 may be comprised of suitable apparatus, equipment and circuity which will serve to energize relay winding 78 when the alternating current applied across terminals 61 and 64 deviates a predetermined amount from a desired frequency and/or amplitude dependent upon the characteristics and requirements of load device 90. Comparator 130 does not form a part of the present invention. Apparatus for performing the functions described therefore are believed within the capabilities of one having skill in the art. As will be explained below, energization of relay winding 78 in response to a deviation from such conditions serves to energize inverter 79 to maintain an uninterrupted supply of alternating current phase, frequency and amplitude synchronism with the current supplied by source of alternating current 100 previous to any detected deviation from the desired characteristics.

An oscillator 10, which is included within the dotted outline in the central portion of the drawing, serves as a source of reference potential for synchronizing inverter 79 with the source of alternating current energy 100. Oscillator 10 comprises an adjustable tuning fork oscillator embodying the principles of my invention which is adapted to automatically remain in frequency and phase synchronism with the source of alternating current energy 100. The tuning fork oscillator includes a tuning fork 11, which is mounted on a suitable mounting means 12, having a pair of upwardly extending tine members and is constructed to have a nominal resonant frequency substantially equal to that of alternating current source 100 or any other source of frequency desired. A driving coil 15, having a core member 101, is placed in proximity and magnetic energy transferring relationship with the right hand tine of tuning fork 11 and a similar pick-up coil 14, having a core member 102, is positioned in magnetic energy transferring relationship with the left hand tine on fork 11. The lower ends of each of the windings are connected to a common ground and a suitable amplifier means 18 is connected intermediate the top ends of coil windings 14 and 15 through conductors 17, 19 and 20. Core members 101 and 102 on coil winding 15 and 14 may be comprised of suitable material exhibiting permanent magnetic characteristics although tuning fork 11 may also be driven by suitable electrostatic means (not shown) but which may be easily determined by one skilled in the art where a nonmagnetic driving and pickup system is desirable. It may be noted at this point that coil windings 14 and 15 in combination with tuning fork 11 comprise a typical prior art tuning fork assembly for use with suitable amplifying means to form a tuning fork oscilator. In applying the principles of my invention to the typical tuning fork, a source of magnetic energy 13, to provide a relatively constant bias flux through the tines of tuning fork 11, as indicated by the dotted lines, and a control coil winding 16, having a core 105, are placed in magnetic energy transferring relationship to fork 11. The relative position of these elements are not critical as long as the magnetic energy provided by source of energy 13 is substantially constant and the actively vibrating portions of the fork are energized therefrom and the magnetic energy from coil winding 16 is likewise applied to the actively vibrating portions of the fork.

By establishing the magnetic flux flow, or bias, through the tines of fork 11 from the source of magnetic energy 13, and modifying the flow of flux through the tines of the fork by application of a direct current to control coil winding 16 in additive or subtractive relationship to the bias flux, the natural frequency of tuning fork 11 may be varied over a substantial range to provide, for instance, frequency synchronism of the tuning fork natural frequency with a source of reference potential. The variation in the natural frequency of vibration of fork 11 results from variations in the level of magnetization within the active vibrating portions of the fork. A change in level of magnetization causes a change in the value of Young's modulus which is proportional to the square root of Young's modulus whereby the relative "stiffness" of the tines of the tuning fork may be controlled to modify the resonant frequency over a range which is adequate for normal applications. The range of frequency variation obtainable for any given tuning fork depends to a large extent upon the material of which the fork is comprised as some materials exhibit a greater change in Young's modulus for changes in magnetization thereof than others. It has been observed that a change of up to plus or minus two cycles per second for a tuning fork having a nominal resonant frequency of 400 cycles per second may be obtained.

It may now be apparent to those skilled in the art that the present invention comprises a novel method and apparatus for providing a source of alternating current which may be easily controlled, or changed, in its frequency of operation.

It may also occur to those skilled in the art upon becoming familiar with the principles of my invention that substantial modifications may be made from the preferred embodiment illustrated in the drawing and described in this specification particularly with regard to the relative positions of the various components associated with tuning fork 11 for driving and controlling the same.

Oscillator 10 also includes apparatus such as integrating means 57 for providing a direct current potential for application to control coil winding 16 through normally closed contact assembly 123 and conductor 59. An integrating means 57 is provided with a plurality of input terminals and is connected to ground through a suitable conductor 110. The input of integrating means 57 is connected to the output thereof through a capacitor 58 and a pair of input terminals, indicated as having positive and negative polarities respectively, are connected to conductors 37 and 56. Conductors 37 and 56 comprise the output of phase comparison means to be described below.

A phase comparison means is provided for comparing the output of the tuning fork oscillator appearing at conductor 19 with a suitable source of reference potential, appearing at conductor 52 connected to conductor 63 in the power distribution system shown in the drawing. The phase comparison means is adapted to provide a positive or a negative potential, dependent upon the phase relationship between the voltages appearing on conductor 19 and conductor 52, at its output on conductors 56 and 37 respectively. The phase comparison means is comprised of a plurality of semi-conductor devices 29, 39, 28, 48, a pair of asymmetrical current conducting devices 22 and 51, and resistors 23, 36, 50 and 55. Each of the semi-conductor devices includes collector, emitter and base electrodes.

Base electrode 30 on semi-conductor device 29 is connected to conductor 19 through conductor 24, resistor 23 and asymmetrical current conducting device 22 and to ground through collector 25, base electrode 26 and emitter electrode 27 on semi-conductor device 28. The collector electrode 31 on semi-conductor 29 is connected to a common source of potential, indicated by the reference character (E) through conductor 32 and the emitter electrode 33 is connected to the negative input terminal on integrator 57 through conductor 34, resistor 36 and conductor 37.

Semi-conductor 39 is shown with its collector electrode 41 connected to source of potential (E) through conductor 32, its base electrode 40 connected to conductor 52 through conductor 44, resistor 50, asymmetrical current conducting device 51 and normally closed contact assembly 124, and its emitter electrode 43 connected to the positive input terminal on integrator 57 through conductor 54, resistor 55 and conductor 56. Base electrode 40 is also connected to ground through collector electrode 45, base electrode 46 and emitter electrode 47 on semi-conductor device 48.

Base electrode 26 on semi-conductor device 28 is connected to emitter electrode 43 on semi-conductor device 39 through conductor 35. Base electrode 46 on semi-conductor device 48 is connected to emitter electrode 33 on semi-conductor device 29 through conductor 49.

Conductor 19, connected to the output of amplifier 18 on oscillator 10, is connected to an input terminal 80 on inverter 79 through conductor 21.

As noted above, the system which embodies the invention includes a primary source of power and a standby source of power which is adapted to be energized upon deviation of the primary source from predetermined standards relating to magnitude and/or frequency. The source of standby power must be operative upon failure of the primary source to provide an output of predetermined magnitude and in phase synchronism with that previously supplied by the primary source before failure, for any reason.

In the present embodiment, inverter 79 supplies the standby power and is of the type that is adapted to be synchronized in frequency with a source of reference potential as furnished by oscillator 10. Because of the requirement for phase synchronism and continuous power, the phase of oscillator 10 must be stabilized with a reference and in the present embodiment, primary source 100 serves this purpose.

The operation of the apparatus shown in the drawing will therefore be described first in connection with the operation of oscillator 10 and then the operation of the entire system. For purposes of explanation, it will be assumed that the source of alternating current energy, 100, the primary source, is operative and upon energization of oscillator 10 by supplying energy to amplifier means 18 from a source of energy (not shown) tuning fork will oscillate in a manner well known in the art as provided by the positive feed-back phenomena between driving coil winding 15 and pick-up coil winding 14 to cause the tines of fork 11 to vibrate in response to magnetic energy applied thereto. The output of amplifying means 18 appears at conductor 19 and is thence applied through asymmetrical current conducting device 22 and resistor 23 to base electrode 30 on semi-conductor device 29. Simultaneously the potential appearing at terminal 53 on conductor 63, connected to terminal 61 on source of potential 100, provides a signal representative of the potential appearing thereat to base electrode 40 on semi-conductor device 39 through conductor 52 asymmetrical current conducting device 51, resistor 50 and conductor 44. It will be assumed that conductor 32 is energized from a suitable source of direct current potential (E) which may be, for example, a constant potential source which is readily obtainable from numerous types of apparatus and devices (not shown). Dependent upon the phase and/or frequency relationship between the potentials appearing at base electrodes 30 and 40, one of semi-conductor devices 29 and 39 will become conductive. Assuming that the voltage appearing at conductor 52 is leading the voltage appearing at conductor 19, semi-conductor device 39 will become conductive and current will flow through resistor 55 to apply a potential to base electrode 26 on semi-conductive device 28 to cause it to become conductive and the voltage appearing at conductor 19 will be shunted through semi-conductor device 28 before it is applied to base electrode 30 on transistor 29.

The current will be applied to the input terminal indicated by the positive sign on integrator 57 to thereby affect the output of integrator 57 in a direction which will, in turn, control the level of magnetization of tuning fork 11 to thereby change the natural frequency of operation thereof in a direction which will tend to provide frequency synchronism between the voltages appearing at conductors 52 and 19. The operation is reversed if the voltage appearing at conductor 19 is leading the voltage appearing at conductor 52 and it will be seen that through the integrating function provided by integrating means 57, a direct current will be applied to control coil winding 16 to energize the same to provide the level of magnetization in additive or subtractive relationship to the level established by source of magnetic energy 13 to tend to maintain the natural resonant frequency of vibration of tuning fork 11 at the desired frequency of operation. In the embodiment shown, as the magnitude of current supplied to control coil winding 16 is increased, the frequency will increase in accordance with such changes. It may therefore be seen that oscillator 10 will provide an output at conductor 21 which is in frequency synchronism with source of energy 100.

*System operation*

In the operation of the system, the conditions as shown on the drawing prevail when load device 90 is energized from source of alternating current energy 100 through terminals 61 and 64 and the conductors as indicated above. During such time, a suitable comparator 100 that is connected across conductors 62 and 65 may be provided to continuously monitor the frequency and/or magnitude of the alternating current appearing across the conductors. A suitable technique for monitoring the frequency is believed within the capabilities of one skilled in the art and may be, for example, a digital counting device for frequency monitoring. The amplitude of the power source may be compared with a suitable source of reference potential. In either event, the accuracy and speed of response necessary in any given system will determine the characteristics of apparatus utilized to detect any deviations from the desired conditions of frequency and/or amplitude.

When a deviation from the predetermined conditions is detected by comparator means 130, a current is applied to coil winding 78 connected to output terminal 103 and switch contact assemblies 74, 75 and 76 are actuated to positions opposite from those shown in the drawing through driving means 73. Movement of contact assemblies 75 and 76 from the normally open to a closed position serves to connect output terminal 81 on inverter 79 to input terminal 91 on load device 90 to thereby complete a circuit for energizing load device 90 from inverter 79 and to connect input terminal 86 on inverter 79 to the positive terminal on a source of energy therefor, indicated as the battery positive terminal connected to conductor 77 and inverter 79 will immediately begin operation. Simultaneously relay winding 120 is energized so that normally closed contact assemblies 123 and 124 are opened so as to tende to maintain oscillator 10 at the same frequency of operation as that of source 100 before a material deviation from the desired frequency was detected. The frequency and phase relationship of the output of inverter 79 is controlled from its connection through conductor 21 to oscillator 10 so that upon switching from source of power 100 to inverter 79 for energization of load device 90, there is no discontinuity in the flow of power to load device 90 and the power supplied by inverter 79 will provide continued operation of load device 90 with energy of substantially the same frequency, phase and amplitude as that previously supplied by power source 100. It should be noted at this point that the frequency of oscillator 10 will gradually and smoothly attain the natural frequency of tuning fork 11 wihch may be 1 or 2 c.p.s. higher or lower than the frequency of source 100. Simultaneously with actuation of contact assemblies 75 and 76, normally closed contact assembly 74 is opened to disconnect input terminal 91 on load device 90 from conductor 63 connected to source of power 100.

Should source 100 resume operation at the desired condition of operation, comparator 130 will respond to first de-energize relay winding 120 to allow normally closed contact assemblies 123 and 124 to assume their normal position. Oscillator 10 will synchronize with source 100 and a predetermined time interval later, relay winding 78 will de-energize to connect load device 90 to conductor 63 and disconnect and de-energize inverter 79.

In the illustrated embodiment of oscillator 10, the integrator may be, for example, an integrator as disclosed in "Electronic Designer's Handbook" by Robert W. Landee et al., McGraw-Hill, New York, 1957, Sec. 19–14. A suitable tuning fork oscillator circuit may be found in "Feed-back Control System Analysis and Synthesis," by John J. D'Azzo et al., McGraw-Hill, New York, 1960, Sec. 19–2 in which a suitable operational amplifier is utilized in combination with a tuning fork to provide an oscillator.

It is understood that suitable modifications may be made in the structure as disclosed, provided such modifications come within the spirit and scope of the appended claims. Having now therefore fully illustrated and described my invention, what I claim to be new and desire to protect by Letters Patent is:

1. Apparatus for controlling the frequency of a tuning fork comprising in combination;
(a) a tuning fork
(b) a first source of magnetic energy mounted in magnetic energy transferring relationship to said tuning fork
(c) input and output means magnetically associated with said fork, said input and output means being interconnected by amplifying means
(d) an alternating reference potential and
(e) means responsive to variations in frequency synchronism between said alternating reference potential and said output means for controlling the magnitude of magnetic energy transferred to said tuning fork.

2. Apparatus for controlling the frequency of a tuning fork comprising in combination;
(a) a ferro-magnetic tuning fork
(b) a first source of magnetic energy mounted in magnetic energy transferring relationship to said tuning fork
(c) input and output means magnetically associated with said fork, said input and output means being interconnected by amplifier means
(d) an alternating reference potential and
(e) means responsive to variations in frequency synchronism between said alternating reference potential and the output of said amplifier means for controlling the magnitude of magnetic energy transferred to said tuning fork.

3. A variable frequency tuning fork oscillator comprising in combination;
(a) a ferro-magnetic tuning fork
(b) input and output windings mounted in operative relationship thereto
(c) amplifier means interconnecting said input and output windings
(d) a source of reference potential
(e) signal responsive means for establishing and controlling the flow of magnetic flux through the tines of said tuning fork
(f) further means connected to said output winding and said source of reference potential for providing a signal indicative of variations in frequency synchronism between said output and said reference potential and
(g) means connecting the output of said further means to said signal responsive means.

4. The apparatus of claim 3 in which a source of magnetic energy is positioned in energy transferring relationship with the tines of the tuning fork.

5. In combination with a ferro-magnetic fork oscillator,
(a) a constant source of magnetic energy mounted in energy transferring relationship with the active vibrating portions of a tuning fork so as to establish a flow of magnetic energy therethrough;
(b) signal responsive means for controlling the magnetic energy in said active vibrating portions mounted in energy transferring relationship with at least a portion of said active vibrating portions;
(c) a source of reference potential;
(d) signal producing means responsive to the difference between the frequency of the output of said tuning fork and said source of reference potential for establishing a signal proportional to said difference in frequency;
(e) and circuit means, including signal integrating means, interconnecting said signal producing means and said signal responsive means.

6. The apparatus of claim 5 in which the signal responsive means includes a coil winding and said coil winding is mounted so that magnetic energy transferred to the vibrating portions of the tuning fork is present in portions of the tuning fork remotely located from the portions associated with a driving means therefor.

References Cited by the Examiner

UNITED STATES PATENTS

| | | | |
|---|---|---|---|
| 1,809,832 | 6/1931 | Curtis | 331—156 X |
| 2,928,308 | 3/1960 | Godbey | 331—156 X |

OTHER REFERENCES

O'Connor: "Tuning-Fork Audio Filter Tunes Electrically," Electronics, December 2, 1960, pages 66, 67.

ROY LAKE, *Primary Examiner.*

S. H. GRIMM, *Assistant Examiner.*